(12) United States Patent
Mih et al.

(10) Patent No.: US 6,448,629 B2
(45) Date of Patent: *Sep. 10, 2002

(54) SEMICONDUCTOR DEVICE AND METHOD OF MAKING SAME

(75) Inventors: Rebecca D. Mih, Wappingers Falls; Kevin S. Petrarca, Newburgh, both of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 29 days.

(21) Appl. No.: 09/354,742

(22) Filed: Jul. 29, 1999

(51) Int. Cl.⁷ .................................. H01L 29/06
(52) U.S. Cl. ........................ 257/622; 285/626
(58) Field of Search ................. 257/623, 622, 257/626, 752, 704, 628

(56) References Cited

U.S. PATENT DOCUMENTS

| | | | |
|---|---|---|---|
| 4,032,373 A | * | 6/1977 | Koo |
| 4,385,975 A | | 5/1983 | Chu et al. |
| 4,857,988 A | * | 8/1989 | Fottler |
| 4,952,274 A | | 8/1990 | Abraham |
| 5,343,076 A | * | 8/1994 | Katayama et al. |
| 5,445,998 A | | 8/1995 | Zimmer |
| 5,618,757 A | | 4/1997 | Bothra et al. |
| 5,621,241 A | * | 4/1997 | Jain |
| 5,663,107 A | | 9/1997 | Peschke et al. |
| 5,728,507 A | | 3/1998 | Rhoades et al. |
| 6,071,809 A | * | 6/2000 | Zhao |
| 6,127,089 A | * | 10/2000 | Subramanian et al. |

\* cited by examiner

Primary Examiner—Sheila V. Clark

(57) ABSTRACT

A second or cap dielectric layer is interposed between the usual or base dielectric layer and the metallic circuitry layer of a semiconductor device. The base dielectric layer has a plurality of recesses in an inactive part of the semiconductor device into which parts of the cap dielectric layer extend to interlock the cap dielectric layer to the base dielectric layer and to oppose shearing or tearing of the either (1) the metallic circuitry layer as the metallic circuitry layer is subjected to chemical-mechanical polishing, or (2) a hard mask layer from the base dielectric layer as the metallic circuitry layer is subjected to chemical-mechanical polishing.

11 Claims, 3 Drawing Sheets

SEMICONDUCTOR DEVICE AND METHOD OF MAKING SAME

TECHNICAL FIELD

The present invention relates generally to the formation and construction of semiconductor devices and, more particularly, to enhancing the integrity of mechanically weak dielectric substrate layers so that interfaces between such substrate layers and hard mask layer or circuitry layers can withstand subsequently applied chemical-mechanical polishing forces.

BACKGROUND OF THE INVENTION

Referring to FIGS. 1 through 4, which illustrate various stages in the conventional formation of semiconductor devices, a hard mask layer 10, typically silicon based, is deposited on a dielectric substrate layer 12, typically carbon based. Next, a photomask 14 is formed on the top surface of hard mask layer 10 as illustrated in FIG. 1. A pattern is formed in photomask 14 (a step not illustrated), typically by lithography. Recesses 16 are etched, using the pattern of photomask 14, through hard mask layer 10 and into dielectric substrate layer 12. Recesses 16 extend only partially through dielectric substrate layer 12, as illustrated in FIG. 2, when intended for lines and extend completely through dielectric substrate layer 12 when intended for vias.

After photomask 14 is removed, a metallic layer 18 is applied, for example by plating, over hard mask layer 10 and to the walls and bottom surfaces of recesses 16. The resulting structure is illustrated in FIG. 3. Next, those portions of metallic layer 18 on top of hard mask layer 10 are removed by chemical-mechanical polishing (CMP). The resulting structure is illustrated in FIG. 4.

The lateral forces, applied during chemical-mechanical polishing, are transferred as shear forces to the interface 20 between hard mask layer 10 and dielectric substrate layer 12. Such shear forces tend to cause separation of hard mask layer 10 from dielectric substrate layer 12. It should be noted that similar shearing or tearing problems can arise during chemical-mechanical polishing when the semiconductor device is formed without a hard mask layer (i.e., when the metallic circuitry layer is applied directly to the substrate). The exposure of dielectric substrate layer 12 to the chemical solution used during chemical-mechanical polishing can have adverse effects on the nature and character of dielectric substrate layer 12.

New, organic, low dielectric constant substrate materials typically require an inorganic hard mask layer for protection from chemical-mechanical polishing damage. A large, lateral interface between the organic material substrate layer and inorganic material hard mask layer is typically weak and, as indicated above, often cannot withstand chemical-mechanical polishing forces which are applied subsequent to metalization to remove the metallic circuitry layer above the hard mask.

Mechanical integrity of the material at interface 20 between the lower surface of the hard mask layer 10 and the upper surface of the dielectric substrate layer 12 during chemical-mechanical polishing tends to be a problem when processing materials that are softer or weaker than, for example, oxide or nitride. Although many improvements have been made to the upper interface 21 between the top surface of hard mask layer 10 and the lower surface metallic layer 18 placed on top of hard mask layer 10, mechanical integrity is still a major problem with lower interface 20.

The deficiencies of the conventional semiconductor devices show that a need still exists for an improved device and method of manufacture. An object of the present invention is to provide a semiconductor device and a method of manufacture able to withstand chemical-mechanical polishing forces applied during manufacture. A related object is to enhance the mechanical integrity of the dielectric substrate component of a semiconductor device.

SUMMARY OF THE INVENTION

To achieve these and other objects, and in view of its purposes, the present invention provides a method for forming semiconductor devices. In accordance with the present invention, the method includes the steps of providing a substrate and applying a photomask to the substrate. Next, a selected thickness of selected parts of the substrate is removed by etching. After the photomask is removed, a cap dielectric layer is deposited onto the substrate with portions of the cap dielectric layer extending into spaces in the substrate from which parts of the substrate have been etched.

A semiconductor device, constructed in accordance with the present invention, includes a substrate having recesses extending inwardly from a surface of the substrate and a cap dielectric layer against the substrate having portions extending into the recesses in the substrate.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1 illustrates a semiconductor device following the sequential formation of a photomask over a hard mask layer over a dielectric substrate layer;

FIG. 2 illustrates the device of FIG. 1 after recesses are etched, using the pattern of the photomask, through the hard mask layer and into the dielectric substrate layer;

FIG. 3 illustrates the device of FIG. 2 after the photomask is removed and a metallic layer is applied over the hard mask layer and to the walls and bottom surfaces of the recesses;

FIG. 4 illustrates the device of FIG. 3 after those portions of the metallic layer on top of the hard mask layer are removed;

FIG. 5 illustrates a substrate (having a base dielectric layer and a hard mask) with a photomask applied to the substrate and a selected thickness of selected parts of the substrate removed by etching;

FIG. 6 illustrates the device of FIG. 5 after the photomask is removed;

FIG. 7 illustrates the device of FIG. 6 after a cap dielectric layer is deposited onto the substrate;

FIG. 8 illustrates a base dielectric layer substrate with a photomask applied to the substrate and a selected thickness of selected parts of the substrate removed by etching;

FIG. 9 illustrates the device of FIG. 8 after the photomask is removed; and

FIG. 10 illustrates the device of FIG. 9 after a cap dielectric layer is deposited onto the substrate.

DETAILED DESCRIPTION OF THE INVENTION

Figure 1:
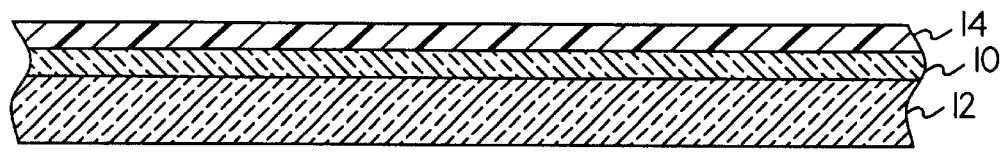
FIGS. 1 through 4 show various stages in the conventional formation of semiconductor devices and, in particular.
Figure 2:
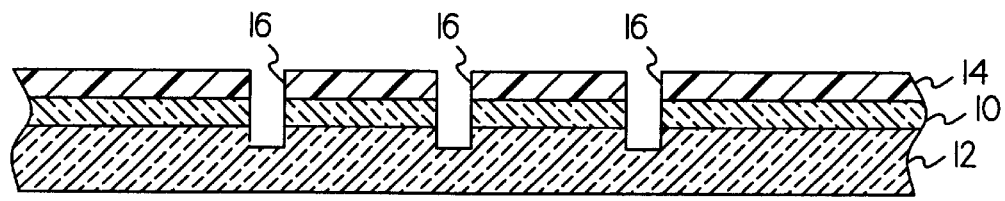
Figure 3:
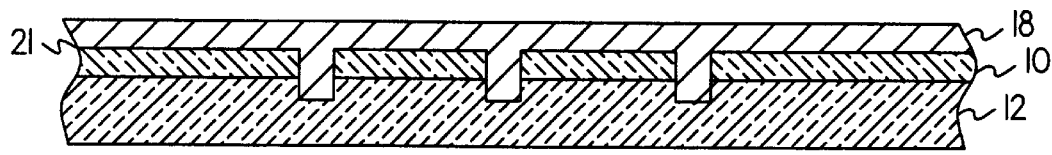
Figure 4:
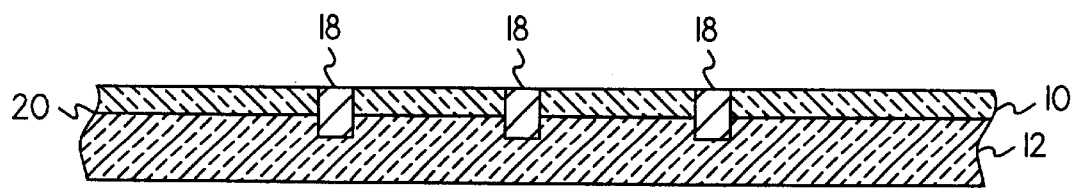
Figure 5:
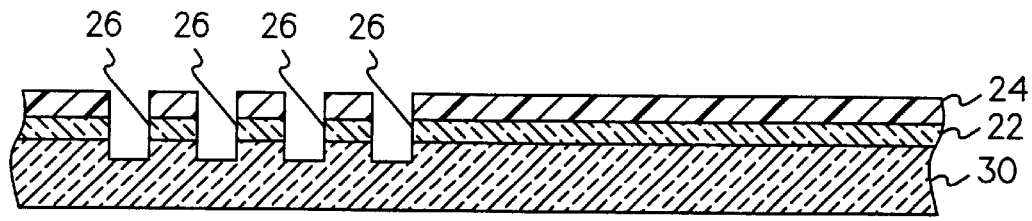
FIGS. 5 through 7 show various stages in the formation of semiconductor devices in accordance with a first embodiment of the present invention and, in particular.
Figure 6:
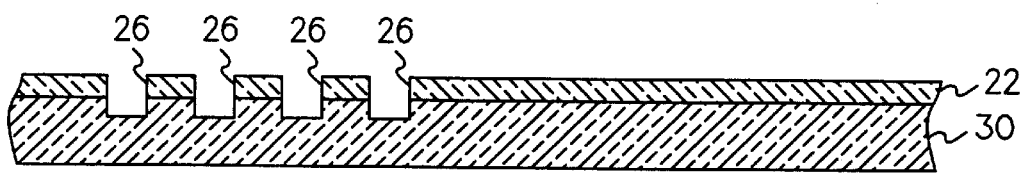
Figure 7:
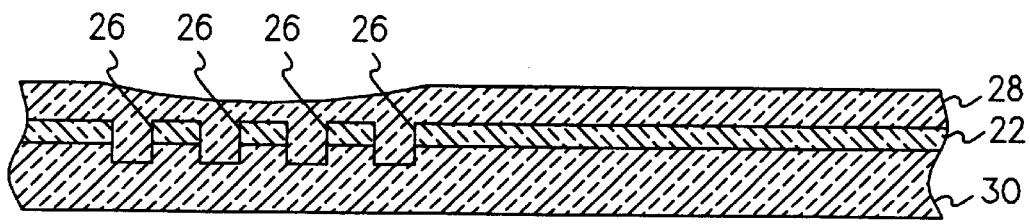

Referring now to FIGS. 5 through 7, in which like reference numbers refer to like elements throughout, a semiconductor device constructed in accordance with a first embodiment of the present invention is formed as follows. A substrate having a base dielectric layer 30 and a hard mask 22 is provided and a photomask 24 is applied to the substrate. For the embodiment of the invention being described, and as illustrated in FIG. 5, photomask 24 is applied to hard mask 22. Base dielectric layer 30 can be an organic material (such as benzocyclobutanes, parylene-N, parylene-F, or polyamides) or an inorganic material (such as inorganic xerogels, SiCOH, hexametholsylsesquoixane, fluorinated spin-on glass, or spin-on glass). Hard mask 22 can be SiCOH, SiN, or $SiO_2$. photomask 24 can be a photosensitive polymer. A metal can be used but must be removed before subsequent layers are formed.

Next, also as illustrated in FIG. 5, a selected thickness of selected parts of the substrate is removed by etching. The etched parts of the substrate are in the form of recesses 26 in an inactive part of the semiconductor device being formed and extend completely through hard mask 22 and partially through base dielectric layer 30. For the embodiment of the invention being described, base dielectric layer 30 is etched in a pure oxygen-Ar mixture with at least 3:1 etch selectivity between an organic base dielectric layer and the silicon-containing photomask 24. The thickness of photomask 24 preferably is less than the thickness of organic base dielectric layer 30 and the etch preferably should remove less than one-half of the total thickness of base dielectric layer 30 to achieve the desired vertical adhesion enhancement effect to be described below.

Next photomask 24 is removed. Photomask 24 can be removed with an acid wash, a solvent cleaning procedure, or both or by using a fluorine-based chemistry reactive ion etch, which might result in a ten percent change in the mask lateral dimension. The structure that results after photomask 24 is removed is illustrated in FIG. 6.

Next, a cap dielectric layer 28 is deposited onto the substrate. Portions of cap dielectric layer 28 extend into the spaces (i.e., recesses 26) in the substrate from which parts of the substrate have been etched. For the embodiment of the invention being described, cap dielectric layer 28 is deposited onto hard mask 22. The resulting structure is illustrated in FIG. 7.

Cap dielectric layer 28 can be a spin-on glass (e.g., fluorinated oxide). Cap dielectric layer 28 typically is spun onto hard mask 22 to 300-500 Å and as much as 5,000 Å above the top surface of hard mask 22. By using a liquid dielectric, cap dielectric layer 28 is locally planar in the areas that will be patterned. Cap dielectric layer 28 can serve as a hard mask (thin layer) or as the second dual damascene layer (thicker layer) for a dual damascene sequence.

As a result, by using a separate masking step, vertical sidewalls have been introduced into base dielectric layer 30 at an inactive part of the semiconductor device, whereby adhesion to base dielectric layer 30 is enhanced by the interlock of the parts of cap dielectric layer 28 and recesses 26 in base dielectric layer 30. The interlock between base dielectric layer 30 and cap dielectric layer 28 enhances the resistance to shearing or tearing away of hard mask 22 as a metallic circuitry layer (not shown in FIG. 7 but which is deposited over cap dielectric layer 28) is subjected to chemical-mechanical polishing. It should be noted that cap dielectric layer 28 can be an inorganic material, such as SiN, SiCOH, $SiO_2$, or spin-on glass, when the base dielectric material is an organic material.

Figure 8:
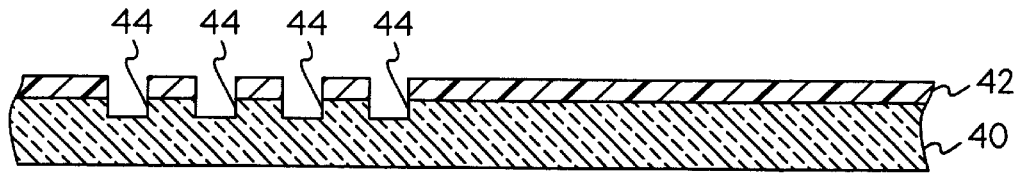
FIGS. 8 through 10 show various stages in the formation of semiconductor devices in accordance with a second embodiment of the present invention and, in particular.
Figure 9:
Figure 10:
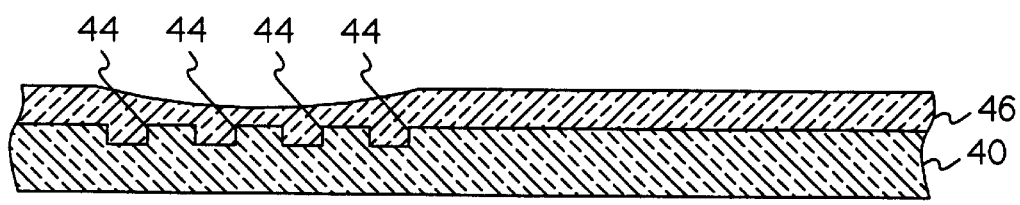

Referring now to FIGS. 8 through 10, in which like reference numbers refer to like elements throughout, a semiconductor device constructed in accordance with a second embodiment of the present invention is formed as follows. A substrate comprising a base dielectric layer 40 is provided with a photomask 42 that is applied directly to base dielectric layer 40. In contrast to the first embodiment of the invention, the substrate does not have a hard mask applied to base dielectric layer 40.

Next, as illustrated in FIG. 8, a selected thickness of selected parts of base dielectric layer 40 is removed by etching. The etched parts of the substrate are in the form of recesses 44 in an inactive part of the semiconductor device being formed and extend partially through base dielectric layer 40.

Next, photomask 42 is removed. The structure that results after photomask 42 is removed is illustrated in FIG. 9. A cap dielectric layer 46 is deposited onto the substrate with portions of cap dielectric layer 46 extending into the spaces (i.e., recesses 44) in base dielectric layer 40 from which parts of base dielectric layer 40 have been etched. For the embodiment of the invention being described, cap dielectric layer 46 is deposited directly onto base dielectric layer 40 and functions as a hard mask. The resulting structure is illustrated in FIG. 10. Cap dielectric layer 46 can be inorganic material, such as Dow Chemical Fox, 650 F, when base dielectric layer 40 is an organic material.

Again, by using a separate masking step, vertical sidewalls have been introduced into base dielectric layer 40 at an inactive part of the semiconductor device, whereby adhesion to the base dielectric layer is enhanced by the interlock of the parts of cap dielectric layer 46 and recesses 44 in base dielectric layer 40. The interlock between base dielectric layer 40 and cap dielectric layer 46 enhances the resistance to shearing or tearing away as a metallic circuitry layer (not shown in FIG. 10 but which is deposited over cap dielectric layer 46) is subjected to chemical-mechanical polishing.

Although illustrated and described above with reference to certain specific embodiments, the present invention is nevertheless not intended to be limited to the details shown. Rather, various modifications may be made in the details within the scope and range of equivalents of the claims and without departing from the spirit of the invention. Specifically, the present invention has been described in connection with a single damascene semiconductor device. It will be apparent to those skilled in the art, however, that the present invention can be applied to dual damascene semiconductor devices.

What is claimed:

1. A semiconductor device comprising:
    a substrate having recess extending inwardly from a surface of the substrate; and a cap dielectric layer comprising an inorganic material, against said substrate having portions extending into and fully filling said recesses in said substrate in locking engagement, wherein said substrate includes a base dielectric layer and a hard mask.

2. The semiconductor device according to claim 1 wherein said recesses are in an inactive part of the semiconductor device.

3. The semiconductor device according to claim 2 wherein said substrate is a base dielectric layer.

4. A semiconductor device comprising:

a substrate having recesses extending inwardly from a surface of the substrate, and a cap dielectric layer comprising an organic material, against said substrate having portions extending into and fully filling said recesses in said substrate in locking engagement, wherein said substrate includes a base dielectric layer and a hard mask.

5. The semiconductor device according to claim 4 wherein said base dielectric layer is an inorganic material.

6. The semiconductor device according to claim 5 wherein said base dielectric layer is selected from the group consisting of inorganic xerogels, SiCOH, hexametholsylsesquoixane, fluorinated spin-on glass, and spin-on glass.

7. The semiconductor device according to claim 3 wherein said base dielectric layer is an organic material.

8. The semiconductor device according to claim 7 wherein said base dielectric layer is selected from the group consisting of benzocyclobutanes, parylene-N, parylene-F, and polyamides and said cap dielectric layer is selected from the group consisting of SiN, SiCOH, $SiO_2$, and spin-on glass.

9. The semiconductor device according to claim 7 wherein said base dielectric layer is selected from the group consisting of benzocyclobutanes, parylene-N, parylene-F, and polyamides and said cap dielectric layer is selected from the group consisting of SiN, SiCOH, $SiO_2$, and spin-on glass.

10. The semiconductor device according to claim 4 wherein said base dielectric layer is an inorganic material.

11. The semiconductor device according to claim 10 wherein said base dielectric layer is selected from the group consisting of inorganic xerogels, SiCOH, hexametholsylsesquoixane, fluorinated spin-on glass, and spin-on glass.

* * * * *